(12) United States Patent
Khlat et al.

(10) Patent No.: US 12,057,813 B2
(45) Date of Patent: Aug. 6, 2024

(54) WIDEBAND TRANSMISSION CIRCUIT

(71) Applicant: Qorvo US, Inc., Greensboro, NC (US)

(72) Inventors: Nadim Khlat, Cugnaux (FR); James M. Retz, Cedar Rapids, IA (US)

(73) Assignee: Qorvo US, Inc., Greensboro, NC (US)

( * ) Notice: Subject to any disclaimer, the term of this patent is extended or adjusted under 35 U.S.C. 154(b) by 127 days.

(21) Appl. No.: 17/700,685

(22) Filed: Mar. 22, 2022

(65) Prior Publication Data

US 2022/0407463 A1 Dec. 22, 2022

Related U.S. Application Data

(60) Provisional application No. 63/212,418, filed on Jun. 18, 2021.

(51) Int. Cl.
   *H03F 1/02* (2006.01)
   *H03F 3/24* (2006.01)
   (Continued)

(52) U.S. Cl.
   CPC .......... *H03F 1/0233* (2013.01); *H03F 3/245* (2013.01); *H04B 1/0475* (2013.01); *H04B 1/40* (2013.01);
   (Continued)

(58) Field of Classification Search
   CPC .......... H04B 1/0475; H04B 1/40; H04B 1/69; H04L 25/03828; H04L 25/03993;
   (Continued)

(56) References Cited

U.S. PATENT DOCUMENTS

| | | |
|---|---|---|
| 4,797,898 A | 1/1989 | Martinez |
| 7,663,436 B2 | 2/2010 | Takano et al. |
| | (Continued) | |

FOREIGN PATENT DOCUMENTS

| | | |
|---|---|---|
| CN | 105812073 A | 7/2016 |
| CN | 110798155 A | 2/2020 |
| | (Continued) | |

OTHER PUBLICATIONS

U.S. Appl. No. 17/700,700, filed 2021.*
(Continued)

*Primary Examiner* — Kevin M Burd
(74) *Attorney, Agent, or Firm* — Withrow & Terranova, P.L.L.C.

(57) ABSTRACT

A wideband transmission circuit is provided. The wideband transmission circuit includes a transceiver circuit and a power amplifier circuit(s). The transceiver circuit generates a radio frequency (RF) signal(s) from a time-variant input vector and provides the RF signal(s) to the power amplifier circuit(s). The power amplifier circuit(s) amplifies the RF signal(s) based on a modulated voltage and provides the amplified RF signal(s) to a coupled RF front-end circuit (e.g., filter/multiplexer circuit). In embodiments disclosed herein, the transceiver circuit is configured to apply an equalization filter to the time-variant input vector to thereby compensate for a voltage distortion filter caused by a coupling of the power amplifier circuit(s) and the RF front-end circuit. As a result, it is possible to reduce undesired instantaneous excessive compression and/or spectrum regrowth resulting from the voltage distortion filter to thereby improve efficiency and linearity of the power amplifier circuit(s).

16 Claims, 7 Drawing Sheets

(51) Int. Cl.
  *H04B 1/04* (2006.01)
  *H04B 1/40* (2015.01)
  *H04B 1/69* (2011.01)
  *H04L 25/03* (2006.01)

(52) U.S. Cl.
  CPC ......... *H04B 1/69* (2013.01); *H04L 25/03828* (2013.01); *H04L 25/03993* (2013.01); *H03F 2200/102* (2013.01); *H03F 2200/451* (2013.01); *H04B 2001/0425* (2013.01)

(58) Field of Classification Search
  CPC .. H03F 1/0233; H03F 3/245; H03F 2200/102; H03F 2200/451
  USPC ......................................................... 375/219
  See application file for complete search history.

(56) References Cited

U.S. PATENT DOCUMENTS

| | | | |
|---|---|---|---|
| 7,683,713 | B2 | 3/2010 | Hongo |
| 7,859,338 | B2 | 12/2010 | Bajdechi et al. |
| 8,605,819 | B2 | 12/2013 | Lozhkin |
| 9,036,734 | B1* | 5/2015 | Mauer ................ H04B 1/0475 375/295 |
| 9,065,504 | B2 | 6/2015 | Kwon et al. |
| 9,112,413 | B2 | 8/2015 | Barth et al. |
| 9,356,760 | B2 | 5/2016 | Larsson et al. |
| 9,438,196 | B2 | 9/2016 | Smith et al. |
| 9,560,595 | B2 | 1/2017 | Dakshinamurthy et al. |
| 9,692,366 | B2 | 6/2017 | Pilgram |
| 10,177,719 | B2 | 1/2019 | Gazneli et al. |
| 10,326,408 | B2 | 6/2019 | Khlat et al. |
| 10,361,744 | B1* | 7/2019 | Khlat ...................... H04B 17/13 |
| 11,088,660 | B2 | 8/2021 | Lin et al. |
| 11,387,789 | B2 | 7/2022 | Khlat et al. |
| 11,424,719 | B2 | 8/2022 | Khlat |
| 11,569,783 | B2 | 1/2023 | Nomiyama et al. |
| 2005/0100105 | A1 | 5/2005 | Jensen |
| 2006/0068710 | A1 | 3/2006 | Jensen |
| 2006/0209981 | A1 | 9/2006 | Kluesing et al. |
| 2008/0246550 | A1 | 10/2008 | Biedka et al. |
| 2009/0074106 | A1 | 3/2009 | See et al. |
| 2010/0298030 | A1 | 11/2010 | Howard |
| 2011/0182347 | A1 | 7/2011 | Cheung |
| 2012/0189081 | A1 | 7/2012 | Omoto et al. |
| 2012/0256688 | A1 | 10/2012 | Onishi |
| 2013/0141062 | A1 | 6/2013 | Khlat |
| 2014/0028368 | A1 | 1/2014 | Khlat |
| 2014/0065989 | A1* | 3/2014 | McLaurin ................ H03F 3/189 455/114.3 |
| 2014/0084996 | A1 | 3/2014 | Schwent et al. |
| 2014/0105264 | A1 | 4/2014 | McLaurin et al. |
| 2014/0184337 | A1 | 7/2014 | Nobbe et al. |
| 2014/0213196 | A1 | 7/2014 | Langer et al. |
| 2014/0315504 | A1 | 10/2014 | Sakai et al. |
| 2016/0173030 | A1 | 6/2016 | Langer et al. |
| 2016/0182100 | A1 | 6/2016 | Menkhoff et al. |
| 2017/0005676 | A1 | 1/2017 | Yan et al. |
| 2017/0338842 | A1 | 11/2017 | Pratt |
| 2018/0248570 | A1 | 8/2018 | Camuffo |
| 2019/0068234 | A1 | 2/2019 | Khlat et al. |
| 2019/0245496 | A1 | 8/2019 | Khlat et al. |
| 2019/0296929 | A1* | 9/2019 | Milicevic ............. H04B 1/1018 |
| 2019/0319583 | A1 | 10/2019 | El-Hassan et al. |
| 2019/0356285 | A1 | 11/2019 | Khlat et al. |
| 2020/0106392 | A1 | 4/2020 | Khlat et al. |
| 2020/0136563 | A1* | 4/2020 | Khlat ..................... H03F 1/0233 |
| 2020/0162030 | A1 | 5/2020 | Drogi et al. |
| 2020/0259685 | A1 | 8/2020 | Khlat |
| 2020/0295713 | A1 | 9/2020 | Khlat |
| 2020/0336111 | A1 | 10/2020 | Khlat |
| 2021/0099136 | A1 | 4/2021 | Drogi et al. |
| 2021/0194517 | A1 | 6/2021 | Mirea et al. |
| 2021/0281228 | A1 | 9/2021 | Khlat |
| 2021/0399690 | A1 | 12/2021 | Panseri et al. |
| 2022/0216834 | A1 | 7/2022 | Myoung et al. |
| 2022/0407462 | A1 | 12/2022 | Khlat |
| 2022/0407464 | A1 | 12/2022 | Khlat et al. |
| 2022/0407465 | A1 | 12/2022 | Khlat |
| 2022/0407478 | A1 | 12/2022 | Khlat et al. |
| 2023/0079153 | A1 | 3/2023 | Khlat |
| 2023/0080621 | A1 | 3/2023 | Khlat |
| 2023/0080652 | A1 | 3/2023 | Khlat et al. |
| 2023/0081095 | A1 | 3/2023 | Khlat |
| 2023/0082145 | A1 | 3/2023 | Lin et al. |
| 2023/0238927 | A1 | 7/2023 | Kay et al. |
| 2023/0387859 | A1 | 11/2023 | Drogi et al. |

FOREIGN PATENT DOCUMENTS

| | | |
|---|---|---|
| EP | 2705604 A2 | 3/2014 |
| EP | 2582041 B1 | 4/2018 |
| EP | 2232713 B1 | 10/2018 |
| EP | 3416340 A1 | 12/2018 |

OTHER PUBLICATIONS

U.S. Appl. No. 17/700,826, filed 2021.*
U.S. Appl. No. 16/689,232, filed 2021.*
U.S. Appl. No. 17/507,173, filed 2021.*
Advisory Action for U.S. Appl. No. 17/942,472, mailed Sep. 15, 2023, 3 pages.
Notice of Allowance for U.S. Appl. No. 17/942,472, mailed Oct. 18, 2023, 10 pages.
International Search Report and Written Opinion for International Patent Application No. PCT/US2023/019267, mailed Aug. 3, 2023, 14 pages.
International Search Report and Written Opinion for International Patent Application No. PCT/US2023/060303, mailed Apr. 11, 2023, 12 pages.
U.S. Appl. No. 17/689,232, filed Mar. 8, 2022.
U.S. Appl. No. 17/714,244, filed Apr. 6, 2022.
U.S. Appl. No. 17/700,826, filed Mar. 22, 2022.
Final Office Action for U.S. Appl. No. 17/942,472, mailed Jul. 19, 2023, 16 pages.
International Search Report and Written Opinion for International Patent Application No. PCT/US2022/043600, mailed Jan. 11, 2023, 15 pages.
Non-Final Office Action for U.S. Appl. No. 17/942,472, mailed Feb. 16, 2023, 13 pages.
Extended European Search Report for European Patent Application No. 22195382.1, mailed Feb. 1, 2023, 26 pages.
Extended European Search Report for European Patent Application No. 22195683.2, mailed Feb. 10, 2023, 12 pages.
Non-Final Office Action for U.S. Appl. No. 17/700,700, mailed Apr. 13, 2023, 11 pages.
Bai, W.-D. et al., "Principle of Vector Synthesis Predistortion Linearizers Controlling AM/AM and AM/PM Independently," 2016 IEEE International Conference on Ubiquitous Wireless Broadband (ICUWB), Oct. 16-19, 2016, Nanjing, China, IEEE, 3 pages.
Extended European Search Report for European Patent Application No. 22195695.6, mailed Feb. 14, 2023, 12 pages.
Extended European Search Report for European Patent Application No. 22196188.1, mailed Feb. 2, 2023, 25 pages.
Cho, M., "Analog Predistortion for Improvement of RF Power Amplifier Efficiency and Linearity," A Dissertation presented to the Academic Faculty in partial fulfillment of the requirements for the degree Doctor of Philosophy in the School of Electrical and Computer Engineering, Georgia Institute of Technology, Aug. 2016, available from the Internet: [URL: https://repository.gatech.edu/server/api/core/bitstreams/b8fe5cbb-e5db-4efe-b9a2-eaad5f671f14/content], 113 pages.
Kwak, T.-W. et al., "A 2W CMOS Hybrid Switching Amplitude Modulator for EDGE Polar Transmitters," IEEE Journal of Solid-State Circuits, vol. 42, No. 12, Dec. 2007, IEEE, pp. 2666-2676.
Paek, J.-S. et al., "A -137 dBm/Hz Noise, 82% Efficiency AC-Coupled Hybrid Supply Modulator With Integrated Buck-Boost Converter," IEEE Journal of Solid-State Circuits, vol. 51, No. 11, Nov. 2016, IEEE pp. 2757-2768.

(56) References Cited

OTHER PUBLICATIONS

Non-Final Office Action for U.S. Appl. No. 17/737,300, mailed Aug. 28, 2023, 14 pages.
Extended European Search Report for European Patent Application No. 23153108.8, mailed Jun. 20, 2023, 18 pages.
Williams, P., "Crossover Filter Shape Comparisons," White Paper, Linea Research, Jul. 2013, 13 pages.
Corrected Notice of Allowability for U.S. Appl. No. 17/942,472, mailed Nov. 17, 2023, 6 pages.
Non-Final Office Action for U.S. Appl. No. 17/939,350, mailed Jan. 17, 2024, 11 pages.
Paek, J.-S. et al., "Design of Boosted Supply Modulator With Reverse Current Protection for Wide Battery Range in Envelope Tracking Operation," IEEE Transactions on Microwave Theory and Techniques, vol. 67, No. 1, Jan. 2019, pp. 183-194.
Non-Final Office Action for U.S. Appl. No. 17/689,232, mailed Dec. 11, 2023, 27 pages.
Notice of Allowance and Examiner-Initiated Interview Summary for U.S. Appl. No. 17/737,300, mailed Dec. 19, 2023, 12 pages.
Notice of Allowance for U.S. Appl. No. 17/700,700, mailed Oct. 23, 2023, 9 pages.
Supplemental Notice of Allowability for U.S. Appl. No. 17/700,700, mailed Nov. 8, 2023, 5 pages.
Extended European Search Report for European Patent Application No. 23174010.1, mailed Oct. 10, 2023, 10 pages.
Corrected Notice of Allowability for U.S. Appl. No. 17/737,300, mailed Dec. 27, 2023, 8 pages.
Final Office Action for U.S. Appl. No. 17/689,232, mailed Mar. 26, 2024, 28 pages.
Supplemental Notice of Allowability for U.S. Appl. No. 17/700,700, mailed Feb. 28, 2024, 5 pages.
Advisory Action U.S. Appl. No. 17/689,232, mailed May 23, 2024, 3 pages.
Final Office Action for U.S. Appl. No. 17/939,350, mailed May 21, 2024, 11 pages.
Non-Final Office Action for U.S. Appl. No. 17/700,826, mailed May 15, 2024, 28 pages.

* cited by examiner

WIDEBAND TRANSMISSION CIRCUIT

RELATED APPLICATIONS

This application claims the benefit of provisional patent application Ser. No. 63/212,418, filed Jun. 18, 2021, the disclosure of which is hereby incorporated herein by reference in its entirety.

FIELD OF THE DISCLOSURE

The technology of the disclosure relates generally to a transmission circuit that transmits a radio frequency (RF) signal modulated in a wide modulation bandwidth.

BACKGROUND

Mobile communication devices have become increasingly common in current society for providing wireless communication services. The prevalence of these mobile communication devices is driven in part by the many functions that are now enabled on such devices. Increased processing capability in such devices means that mobile communication devices have evolved from being pure communication tools into sophisticated mobile multimedia centers that enable enhanced user experiences.

The redefined user experience relies on a higher data rate offered by advanced fifth generation (5G) and 5G new radio (5G-NR) technologies, which typically transmit and receive radio frequency (RF) signals in millimeter wave spectrums. Given that the RF signals are more susceptible to attenuation and interference in the millimeter wave spectrums, the RF signals are typically amplified by state-of-the-art power amplifiers to help boost the RF signals to higher power before transmission.

Envelope tracking (ET) is a power management technology designed to improve operating efficiency and/or linearity performance of the power amplifiers. In an ET power management circuit, a power management integrated circuit (PMIC) is configured to generate a time-variant ET voltage based on a time-variant voltage envelope of the RF signals, and the power amplifiers are configured to amplify the RF signals based on the time-variant ET voltage. Understandably, the better the time-variant ET voltage is aligned with the time-variant voltage envelope in time and amplitude, the better the performance (e.g., efficiency and/or linearity) that can be achieved at the power amplifiers. However, the time-variant ET voltage can become misaligned from the time-variant voltage envelope in time and/or amplitude due to a range of factors (e.g., group delay, impedance mismatch, etc.). As such, it is desirable to maintain good alignment between the time-variant voltage and the time-variant voltage envelope at all times and across a wide modulation bandwidth.

SUMMARY

Embodiments of the disclosure relate to a wideband transmission circuit. The wideband transmission circuit includes a transceiver circuit and a power amplifier circuit(s). The transceiver circuit generates a radio frequency (RF) signal(s) from a time-variant input vector and provides the RF signal(s) to the power amplifier circuit(s). The power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the RF signal(s). In this regard, in embodiments disclosed herein, the transceiver circuit is configured to apply an equalization filter to the time-variant input vector to thereby compensate for the voltage distortion filter at the output stage of the power amplifier circuit(s). By applying the equalization filter in the transceiver circuit, it is possible to reduce undesired instantaneous excessive compression and/or spectrum regrowth resulted from the voltage distortion filter to thereby improve efficiency and linearity of the power amplifier circuit(s).

In one aspect, a wideband transmission circuit is provided. The wideband transmission circuit includes a power amplifier circuit coupled to a transmitter circuit via an RF front-end circuit. The power amplifier circuit is configured to amplify an RF signal based on a modulated voltage. The power amplifier circuit is also configured to provide the amplified RF signal to the RF front-end circuit. The wideband transmission circuit also includes an envelope tracking (ET) integrated circuit (ETIC). The ETIC is configured to generate the modulated voltage based on a modulated target voltage. The wideband transmission circuit also includes a transceiver circuit. The transceiver circuit includes a signal processing circuit. The signal processing circuit is configured to generate the RF signal from a time-variant input vector. The transceiver circuit also includes a target voltage circuit. The target voltage circuit is configured to detect a time-variant amplitude envelope of the RF signal from the time-variant input vector. The target voltage circuit is also configured to generate the modulated target voltage based on the detected time-variant amplitude envelope. The transceiver circuit also includes an equalizer circuit. The equalizer circuit is configured to apply an equalization filter to the time-variant input vector to compensate for a voltage distortion filter created on an output stage of the power amplifier circuit by coupling the power amplifier circuit with the RF front-end circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
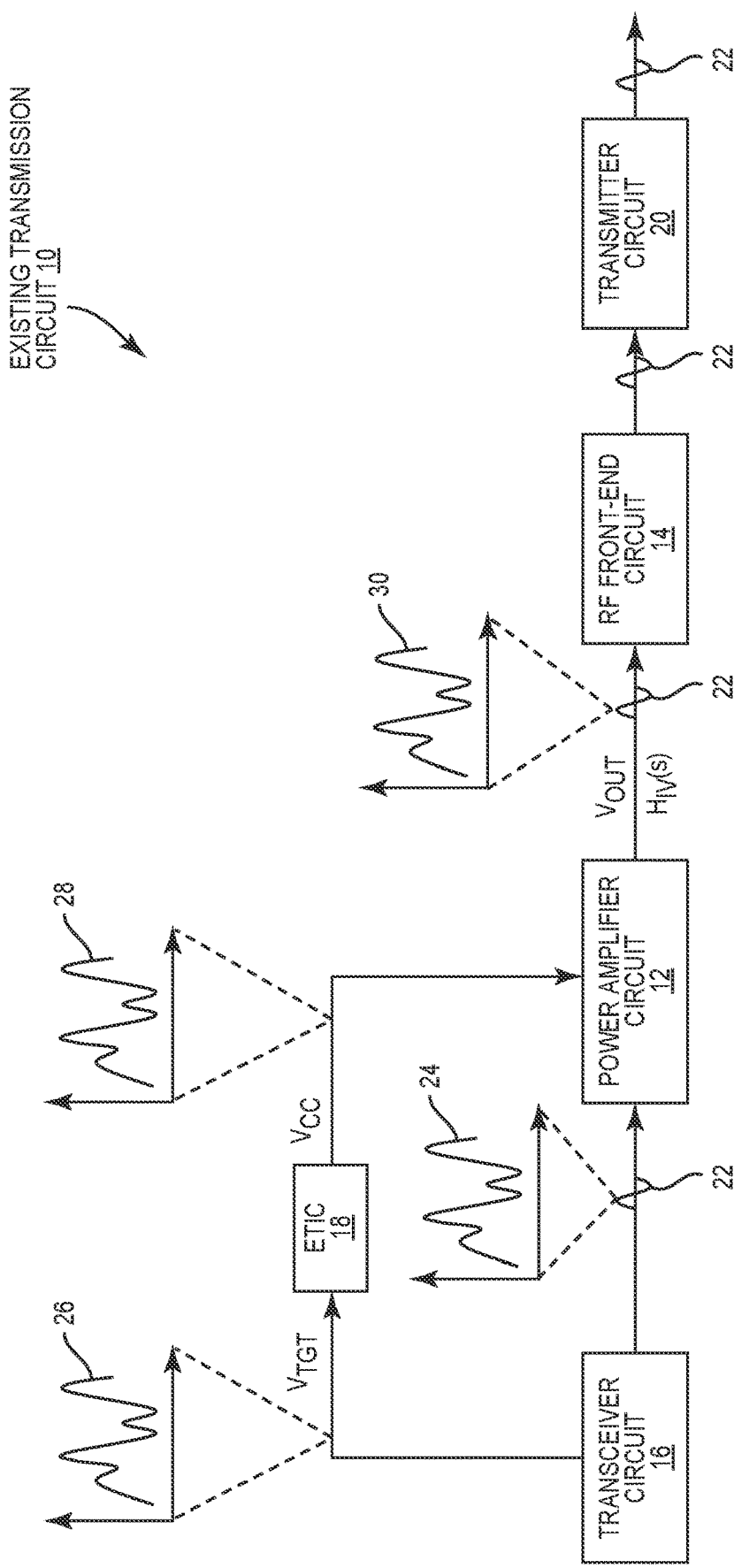
FIG. 1A is a schematic diagram of an exemplary existing transmission circuit, wherein an unwanted voltage distortion filter may be created on a power amplifier circuit when the power amplifier circuit is coupled to a radio frequency (RF) front-end circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a wideband transmission circuit. The wideband transmission circuit includes a transceiver circuit and a power amplifier circuit(s). The transceiver circuit generates a radio frequency (RF) signal(s) from a time-variant input vector and provides the RF signal(s) to the power amplifier circuit(s). The power amplifier circuit(s) amplifies the RF signal(s) based on a modulated voltage and provides the amplified RF signal(s) to a coupled RF front-end circuit (e.g., filter/multiplexer circuit). Notably, when the power amplifier circuit(s) is coupled to the RF front-end circuit, an output reflection coefficient (e.g., $S_{22}$) of the power amplifier circuit(s) can interact with an input reflection coefficient (e.g., $S_{11}$) of the RF front-end circuit to create a voltage distortion filter on an output stage of the power amplifier circuit(s), which can cause unwanted distortion in the RF signal(s). In this regard, in embodiments disclosed herein, the transceiver circuit is configured to apply an equalization filter to the time-variant input vector to thereby compensate for the voltage distortion filter at the output stage of the power amplifier circuit(s). By applying the equalization filter in the transceiver circuit, it is possible to reduce undesired instantaneous excessive compression and/or spectrum regrowth resulting from the voltage distortion filter to thereby improve efficiency and linearity of the power amplifier circuit(s).

Figure 2:
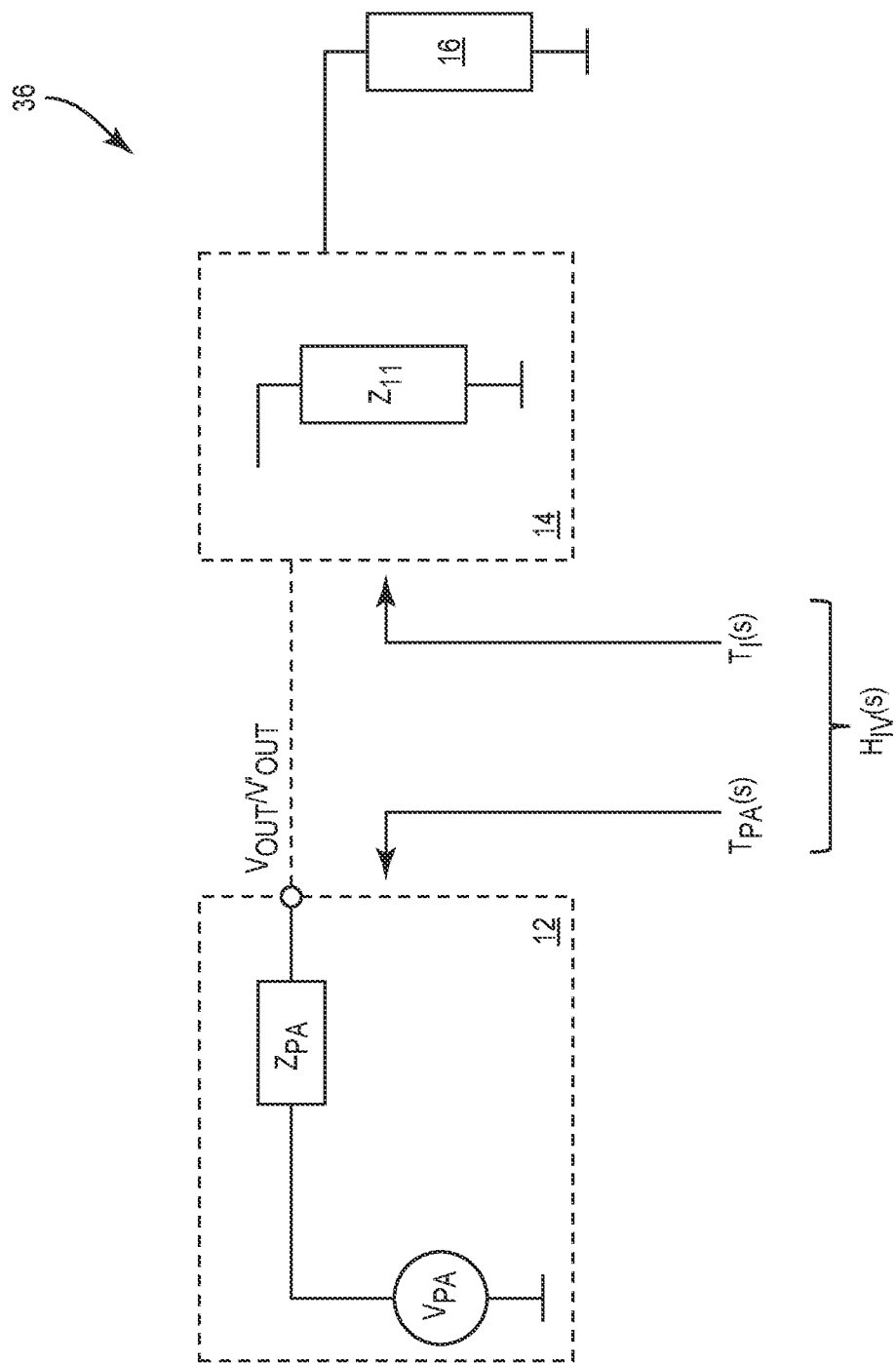
FIG. 2 is a schematic diagram of an exemplary equivalent model providing an exemplary illustration of the unwanted voltage distortion filter created by a coupling between the power amplifier circuit and the RF front-end circuit 14 in FIG. 1A.

Before discussing the wide modulation bandwidth RF transmission circuit according to the present disclosure, starting at FIG. 2, a brief discussion of an existing transmission circuit is first provided to help understand how an unwanted voltage distortion filter may be created when a power amplifier circuit is coupled to an RF front-end circuit, such as a filter/multiplexer circuit.

FIG. 1A is a schematic diagram of an exemplary existing transmission circuit 10, wherein an unwanted voltage distortion filter $H_{IV}(s)$ may be created on a power amplifier circuit 12 when the power amplifier circuit 12 is coupled to an RF front-end circuit 14. Notably, in the unwanted voltage distortion filter $H_{IV}(s)$, "s" is a notation of Laplace transform. The existing transmission circuit 10 includes a transceiver circuit 16, an envelope tracking (ET) integrated circuit (ETIC) 18, and a transmitter circuit 20, which can include an antenna(s) (not shown) as an example.

The transceiver circuit 16 is configured to generate an RF signal 22 associated with a time-variant voltage envelope 24 and provides the RF signal 22 to the power amplifier circuit 12. The transceiver circuit 16 is also configured to generate a time-variant target voltage $V_{TGT}$, which is associated with a time-variant target voltage 26 that tracks the time-variant voltage envelope 24 of the RF signal 22. The ETIC 18 is configured to generate a modulated voltage $V_{CC}$ having a time-variant modulated voltage 28 that tracks the time-variant target voltage 26 of the time-variant target voltage $V_{TGT}$ and provide the modulated voltage $V_{CC}$ to the power amplifier circuit 12. The power amplifier circuit 12 is configured to amplify the RF signal 22 based on the modulated voltage $V_{CC}$ to a time-variant output voltage $V_{OUT}$ associated with a time-variant output voltage envelope 30. The power amplifier circuit 12 then provides the amplified RF signal 22 to the RF front-end circuit 14. The RF front-end circuit 14 may be a filter circuit that performs further frequency filtering on the amplified RF signal 22 before providing the amplified RF signal 22 to the transmitter circuit 20 for transmission.

Figure 1B:
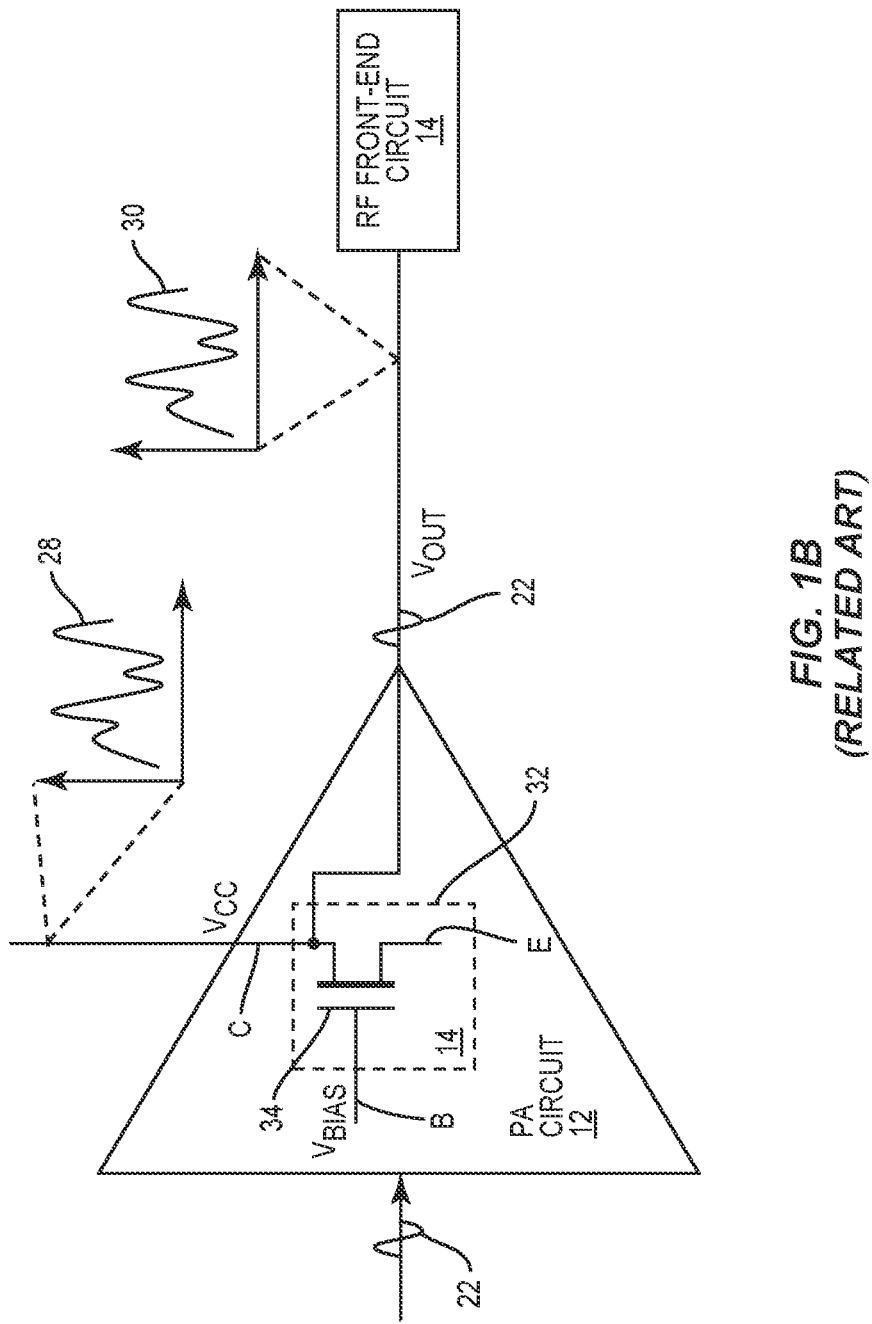
FIG. 1B is a schematic diagram providing an exemplary illustration of an output stage of the power amplifier circuit in FIG. 1A.

FIG. 1B is a schematic diagram providing an exemplary illustration of an output stage 32 of the power amplifier circuit 12 in FIG. 1A. Common elements between FIGS. 1A and 1B are shown therein with common element numbers and will not be re-described herein.

The output stage 32 can include at least one transistor 34, such as a bipolar junction transistor (BJT) or a complementary metal-oxide semiconductor (CMOS) transistor. Taking the BJT as an example, the transistor 34 can include a base electrode B, a collector electrode C, and an emitter electrode E. The base electrode B is configured to receive a bias voltage $V_{BIAS}$ and the collector electrode C is configured to receive the modulated voltage $V_{CC}$. The collector electrode C is also coupled to the RF front-end circuit 14 and configured to output the amplified RF signal 22 at the output voltage $V_{OUT}$. In this regard, the output voltage $V_{OUT}$ can be a function of the modulated voltage $V_{CC}$. Understandably, the power amplifier 12 will operate with good efficiency and linearity when the time-variant modulated voltage 28 is aligned with the time-variant output voltage envelope 30.

FIG. 2 is a schematic diagram of an exemplary equivalent model 36 providing an exemplary illustration of the voltage distortion filter $H_{IV}(s)$ created by a coupling between the power amplifier circuit 12 and the RF front-end circuit 14 in the existing transmission circuit 10 of FIG. 1A. Elements in FIGS. 1A and 1B are referenced in FIG. 2 without being re-described herein.

In the equivalent model 36, $V_{PA}$ and $Z_{PA}$ represent the output stage 32 of the power amplifier circuit 12 and an inherent impedance of the power amplifier circuit 12, respectively, and $Z_{11}$ represents an inherent impedance associated with an input port of the RF front-end circuit 14. Herein, $V_{OUT}$ represents an output voltage associated with the RF signal 22 before the power amplifier circuit 12 is coupled to the RF front-end circuit 14, and $V'_{OUT}$ represents an output voltage associated with the RF signal 22 after the power amplifier circuit 12 is coupled to the RF front-end circuit 14. Hereinafter, the output voltages $V_{OUT}$ and $V'_{OUT}$ are referred to as "non-coupled output voltage" and "coupled output voltage," respectively, for distinction.

A Laplace transform representative of the coupled output voltage $V'_{OUT}$ can be expressed in equation (Eq. 1) below.

$$V'_{OUT}(s) = \frac{V_{OUT}(s) * [1 - T_{PA}(s)] * [1 + T_I(s)]}{2 * [1 - T_{PA}(s) * T_I(s)]} = V_{OUT}(s) * H_{IV}(s) \quad \text{(Eq. 1)}$$

$$H_{IV}(s) = \frac{[1 - T_{PA}(s)] * [1 + T_I(s)]}{2 * [1 - T_{PA}(s) * T_I(s)]}$$

In the equation (Eq. 1) above, $T_{PA}(s)$ represents a reflection coefficient looking back into the output stage 32 of the power amplifier circuit 12 and $T_I(s)$ represents a reflection coefficient looking into the RF front-end circuit 14. Notably, $T_{PA}(s)$ and $T_I(s)$ are complex filters containing amplitude and phase information. In this regard, the $T_{PA}(s)$, the $T_I(s)$, and, therefore, the voltage distortion filter $H_{IV}(s)$ are dependents of such factors as modulation bandwidth, RF spectrum, and/or voltage standing wave ratio (VSWR).

The equation (Eq. 1) shows that the coupled output voltage $V'_{OUT}$ will be altered from the non-coupled output voltage $V_{OUT}$ by the voltage distortion filter $H_{IV}(s)$ when the power amplifier circuit 12 is coupled to the RF front-end circuit 14. As a result, the coupled output voltage $V'_{OUT}$ may become misaligned from the modulated voltage $V_{CC}$, thus causing unwanted distortion in the RF signal 22.

According to various embodiments disclosed herein, it is possible to modify the modulated voltage $V_{CC}$ to compensate for the voltage distortion filter $H_{IV}(s)$ to thereby reduce or eliminate the difference between the non-coupled output voltage $V_{OUT}$ and the coupled output voltage $V'_{OUT}$. As a result, it is possible to reduce undesired instantaneous excessive compression and/or spectrum regrowth resulting from the voltage distortion filter $H_{IV}(s)$.

Figure 3:
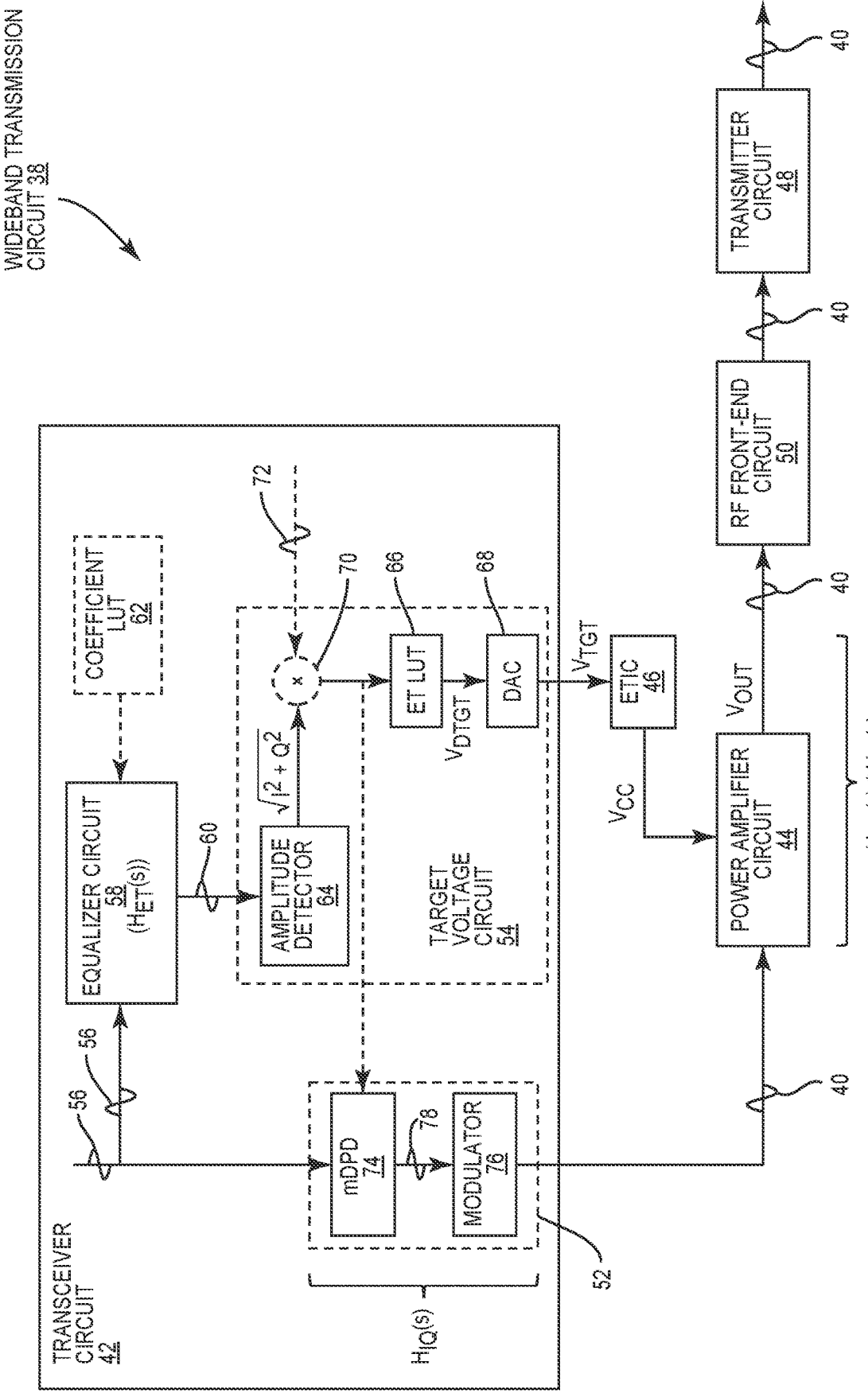
FIG. 3 is a schematic diagram of an exemplary wideband transmission circuit configured according to an embodiment of the present disclosure to compensate for the unwanted voltage distortion filter in the existing transmission circuit of FIG. 1A.

FIG. 3 is a schematic diagram of an exemplary wideband transmission circuit 38 configured according to an embodiment of the present disclosure to compensate for the unwanted voltage distortion filter $H_{IV}(s)$ in the existing transmission circuit 10 of FIG. 1A. The wideband transmission circuit 38 is configured to transmit an RF signal 40 modulated in a wide range of modulation bandwidths. In a non-limiting example, the RF signal 40 can be modulated in a modulation bandwidth of 200 MHz or higher and transmitted in a millimeter wave RF spectrum.

The wideband transmission circuit 38 includes a transceiver circuit 42, a power amplifier circuit 44, and an ETIC 46. The power amplifier circuit 44 is coupled to a transmitter circuit 48 via an RF front-end circuit 50. In a non-limiting example, the RF front-end circuit 50 can include one or more of a filter circuit and a multiplexer circuit (not shown). The filter circuit may be configured to include a filter network, such as an acoustic filter network with a sharp cutoff frequency. The power amplifier circuit 44 may be identical to or functionally equivalent to the power amplifier circuit 12 in FIG. 1B. As such, the power amplifier circuit 44 may also include the output stage 32 as in the power amplifier circuit 12.

The transceiver circuit 42 includes a signal processing circuit 52 and a target voltage circuit 54. The signal processing circuit 52 is configured to generate the RF signal 40 from a time-variant input vector 56. The time-variant input vector 56 may be generated by a digital baseband circuit (not shown) in the transceiver circuit 42 and includes both in-phase (I) and quadrature (Q) components. The target voltage circuit 54 is configured to detect a time-variant amplitude envelope $\sqrt{I^2+Q^2}$ of the RF signal 40 from the time-variant input vector 56. Accordingly, the target voltage circuit 54 can generate a modulated target voltage $V_{TGT}$ based on the detected time-variant amplitude envelope $\sqrt{I^2+Q^2}$.

The ETIC 46 is configured to generate a modulated voltage $V_{CC}$ based on the modulated target voltage $V_{TGT}$ and provide the modulated voltage $V_{CC}$ to the power amplifier circuit 44. The power amplifier circuit 44, in turn, amplifies the RF signal 40 to an output voltage $V_{OUT}$ based on the modulated voltage $V_{CC}$ for transmission via the RF front-end circuit 50 and the transmitter circuit 48.

As previously described, the output voltage $V_{OUT}$ is a function of the modulated voltage $V_{CC}$. In this regard, it is possible to reduce or even eliminate the difference between the non-coupled output voltage $V_{OUT}$ and the coupled output voltage $V'_{OUT}$ by generating the modulated voltage $V_{CC}$ to compensate for the voltage distortion filter $H_{IV}(s)$. Given that the ETIC 46 is configured to generate the modulated voltage $V_{CC}$ based on the modulated target voltage $V_{TGT}$, it is thus possible to reduce or even eliminate the difference between the non-coupled output voltage $V_{OUT}$ and the coupled output voltage $V'_{OUT}$ by generating the modulated target voltage $V_{TGT}$ to compensate for the voltage distortion filter $H_{IV}(s)$.

In this regard, the transceiver circuit 42 further includes an equalizer circuit 58. The equalizer circuit 58 is configured to apply an equalization filter $H_{ET}(s)$ to the time-variant input vector 56 prior to the target voltage circuit 54 generating the modulated target voltage $V_{TGT}$. In an embodiment, the equalization filter $H_{ET}(s)$ can be described by equation (Eq. 2) below.

$$H_{ET}(s) = H_{IQ}(s) * H_{PA}(s) * H_{IV}(s) \quad \text{(Eq. 2)}$$

In the equation (Eq. 2) above, $H_{IQ}(s)$ represents a transfer function of the signal processing circuit 52 and $H_{PA}(s)$ represents a voltage gain transfer function of the power amplifier circuit 44. In this regard, the equalization filter $H_{ET}(s)$ is configured to match a combined signal path filter that includes the transfer function $H_{IQ}(s)$, the voltage gain transfer function $H_{PA}(s)$, and the voltage distortion filter $H_{IV}(s)$.

In an embodiment, the transceiver circuit 42 may also include a coefficient lookup table (LUT) circuit 62, which can be a memory circuit or a register circuit, as an example. The coefficient LUT circuit 62 may be configured to correlate the transfer function $H_{IQ}(s)$, the voltage gain transfer function $H_{PA}(s)$, and the reflection coefficient $T_{PA}(s)$ and $T_I(s)$ with different frequencies and/or VSWR values. In this regard, the equalizer circuit 58 may dynamically create the equalization filter $H_{ET}(s)$ for a specific frequency and/or VSWR value.

In an embodiment, the equalizer circuit 58 applies the equalization filter $H_{ET}(s)$ to the time-variant input vector 56 to generate an equalized time-variant input vector 60 and provides the equalized time-variant input vector 60 to the target voltage circuit 54. The target voltage circuit 54, in turn, detects the time-variant amplitude envelope $\sqrt{I^2+Q^2}$ from the equalized time-variant input vector 60 and generates the modulated target voltage based on the detected time-variant amplitude envelope $\sqrt{I^2+Q^2}$. Since the modulated target voltage $V_{TGT}$ is generated from the equalized time-variant input vector 60, the modulated target voltage $V_{TGT}$, and therefore the modulated voltage $V_{CC}$, will be able to compensate for the voltage distortion filter $H_{IV}(s)$, which is created on the output stage 32 of the power amplifier circuit 44 by coupling the power amplifier circuit 44 with the RF front-end circuit 50.

In an embodiment, the target voltage circuit 54 includes an amplitude detector 64, an ET LUT circuit 66, and a digital-to-analog converter (DAC) 68. The amplitude detector circuit 64 is configured to detect the time-variant amplitude envelope $\sqrt{I^2+Q^2}$ from the equalized time-variant input vector 60. The ET LUT circuit 66 is configured to generate a time-variant digital target voltage $V_{DTGT}$ based on the detected time-variant amplitude envelope $\sqrt{I^2+Q^2}$. The DAC 68 is configured to convert the time-variant digital target voltage $V_{DTGT}$ into the modulated target voltage $V_{TGT}$ and provide the modulated target voltage $V_{TGT}$ to the ETIC 46.

The target voltage circuit 54 may also include a power scaler 70. The power scaler 70 may be configured to scale the detected time-variant amplitude envelope $\sqrt{I^2+Q^2}$ up or down based on a scaling factor 72. Accordingly, the ET LUT circuit 66 may generate the time-variant digital target voltage $V_{DTGT}$ based on the scaled time-variant amplitude envelope $\sqrt{I^2+Q^2}$.

In an embodiment, the signal processing circuit 52 can include a memory digital predistortion (mDPD) circuit 74 and a modulator circuit 76. The mDPD circuit 74 is configured to receive the time-variant input vector 56 and digitally pre-distort the time-variant input vector 56 to generate a pre-distorted time-variant input vector 78. In an embodiment, the mDPD circuit 74 may digitally pre-distort the time-variant input vector 56 based on the detected time-variant amplitude envelope $\sqrt{I^2+Q^2}$ or the scaled time-variant amplitude envelope $\sqrt{I^2+Q^2}$. The modulator circuit 76 is configured to generate the RF signal 40 from the pre-distorted time-variant input vector 78 and provide the RF signal 40 to the power amplifier circuit 44.

Figure 4:
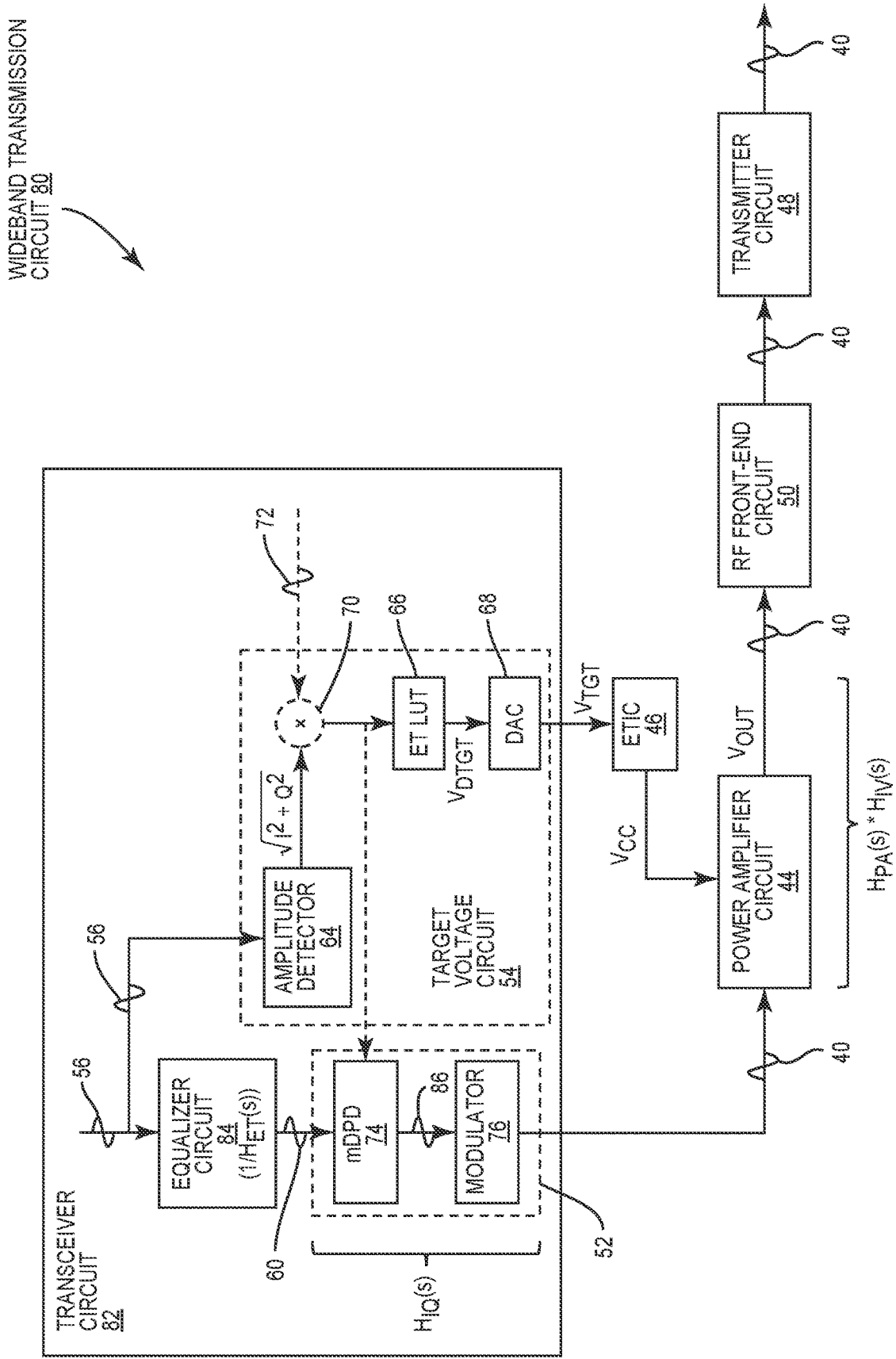
FIG. 4 is a schematic diagram of an exemplary wideband transmission circuit configured according to another embodiment of the present disclosure to compensate for the unwanted voltage distortion filter in the existing transmission circuit of FIG. 1A.

Alternative to compensating for the voltage distortion filter $H_{IV}(s)$ via the target voltage circuit 54, it is also possible to compensate for the voltage distortion filter $H_{IV}(s)$ via the signal processing circuit 52. In this regard, FIG. 4 is a schematic diagram of an exemplary wideband transmission circuit 80 configured according to another embodiment of the present disclosure to compensate for the unwanted voltage distortion filter $H_{IV}(s)$ in the existing transmission circuit 10 of FIG. 1A. Common elements between FIGS. 3 and 4 are shown therein with common element numbers and will not be re-described herein.

The wideband transmission circuit 80 includes a transceiver circuit 82 configured to generate the RF signal 40 and provide the RF signal 40 to the power amplifier circuit 44. In contrast to the transceiver circuit 42 in FIG. 3, the target voltage circuit 54 in the transceiver circuit 82 is configured to detect the time-variant amplitude envelope $\sqrt{I^2+Q^2}$ directly from the time-variant input vector 56.

The transceiver circuit 82 includes an equalizer circuit 84. The equalizer circuit 84 is configured to apply an equalization filter $1/H_{ET}(s)$ to the time-variant input vector 56 to generate the equalized time-variant input vector 60. The equalization filter $1/H_{ET}(s)$ may be described by equation (Eq. 3) below.

$$1/H_{ET}(s) = 1/[H_{IQ}(s) * H_{PA}(s) * H_{IV}(s)] \quad \text{(Eq. 3)}$$

Herein, the signal processing circuit 52 may generate the RF signal 40 from the equalized time-variant input vector 60. Specifically, the mDPD circuit 74 is configured to digitally pre-distort the equalized time-variant input vector 60 to generate a pre-distorted equalized time-variant input vector 86. The modulator circuit 76, in turn, is configured to generate the RF signal 40 from the pre-distorted equalized time-variant input vector 86 and provide the RF signal 40 to the power amplifier circuit 44.

Figure 5:
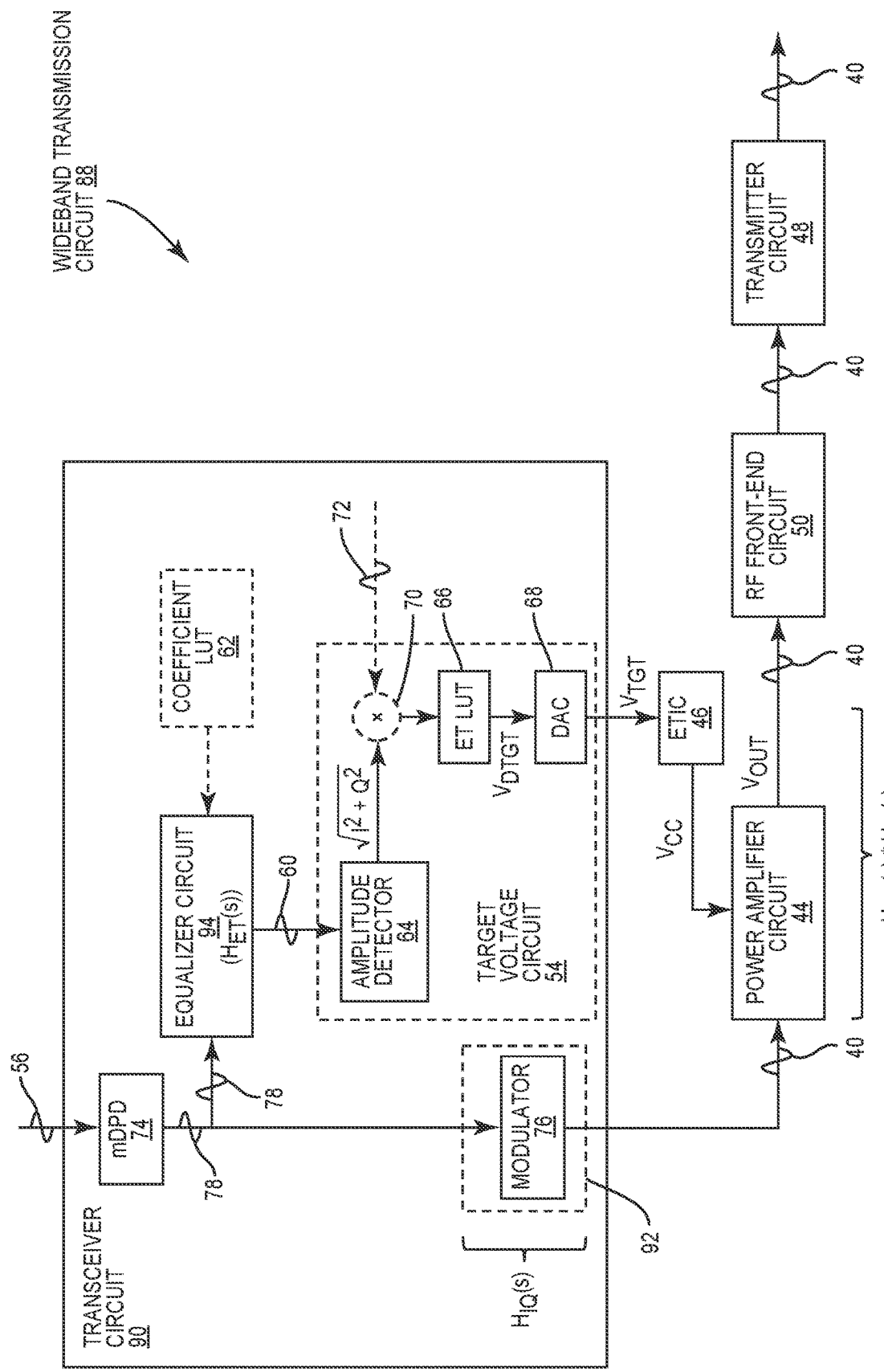
FIG. 5 is a schematic diagram of an exemplary wideband transmission circuit configured according to another embodiment of the present disclosure.

FIG. 5 is a schematic diagram of an exemplary wideband transmission circuit 88 configured according to another embodiment of the present disclosure. Common elements between FIGS. 3 and 5 are shown therein with common element numbers and will not be re-described herein.

The wideband transmission circuit 88 includes a transceiver circuit 90. The transceiver circuit 90 includes a signal processing circuit 92, which includes only the modulator circuit 76. In this embodiment, the mDPD circuit 74 is configured to receive the time-variant input vector 56 and digitally pre-distort the time-variant input vector 56 to generate a pre-distorted time-variant input vector 78. Accordingly, an equalizer circuit 94 is configured to apply the equalization filter $H_{ET}(s)$ to the pre-distorted time-variant input vector 78 prior to the target voltage circuit 54 generating the modulated target voltage $V_{TGT}$.

Figure 6:
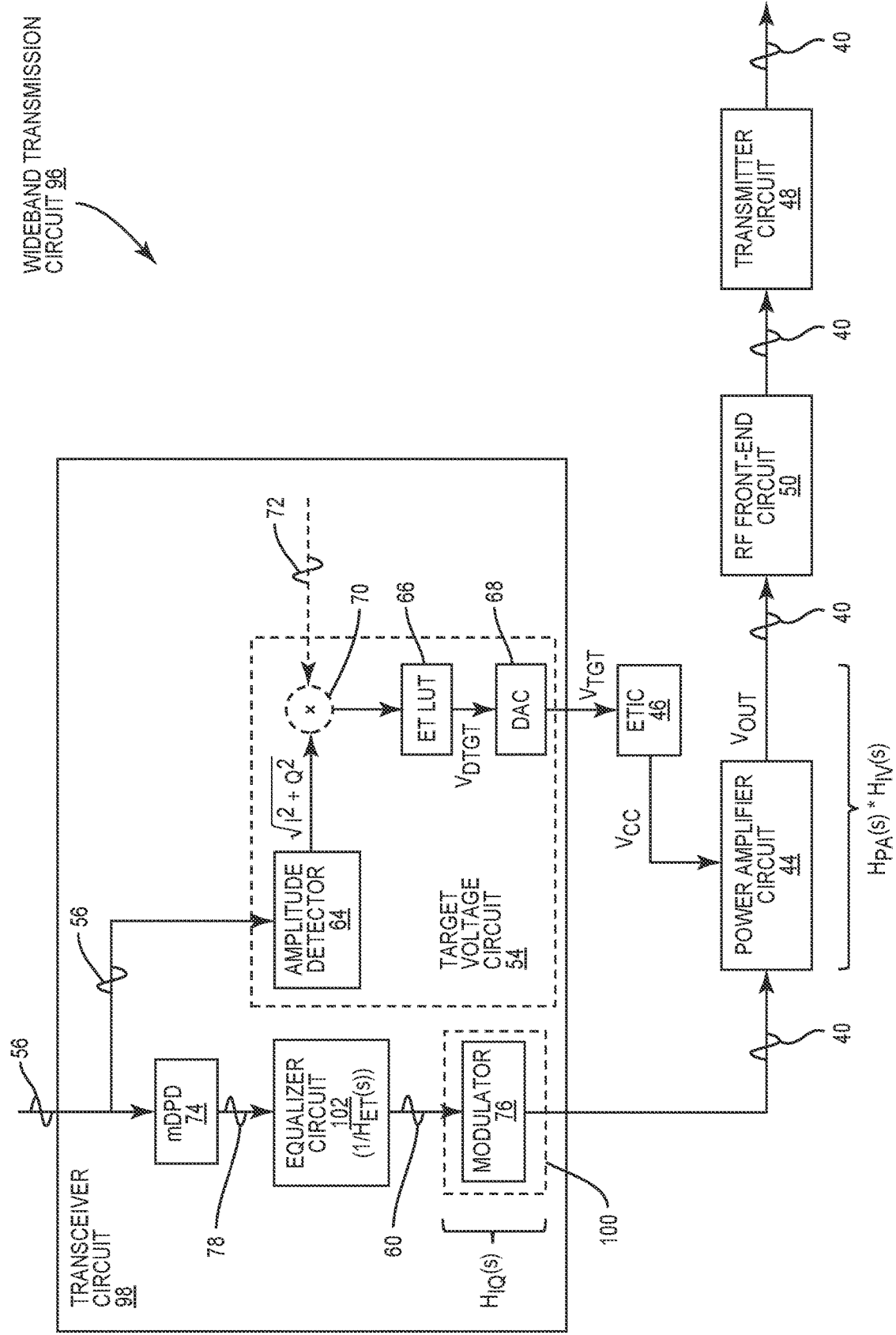
FIG. 6 is a schematic diagram of an exemplary wideband transmission circuit configured according to another embodiment of the present disclosure.

FIG. 6 is a schematic diagram of an exemplary wideband transmission circuit 96 configured according to another embodiment of the present disclosure. Common elements between FIGS. 4 and 6 are shown therein with common element numbers and will not be re-described herein.

The wideband transmission circuit 96 includes a transceiver circuit 98. The transceiver circuit 98 includes a signal processing circuit 100, which includes only the modulator circuit 76. In this embodiment, the mDPD circuit 74 is configured to receive the time-variant input vector 56 and digitally pre-distort the time-variant input vector 56 to generate a pre-distorted time-variant input vector 78. Accordingly, an equalizer circuit 102 is configured to apply the equalization filter $1/H_{ET}(s)$ to the pre-distorted time-variant input vector 78 to generate the equalized time-variant input vector 60.

In an alternative embodiment, the amplitude detector 64 may also be configured to detect the time-variant amplitude envelope $\sqrt{I^2+Q^2}$ from the pre-distorted time-variant input vector 78. As such, the amplitude detector 64 may instead be coupled to an output of the mDPD circuit 74.

Those skilled in the art will recognize improvements and modifications to the preferred embodiments of the present disclosure. All such improvements and modifications are considered within the scope of the concepts disclosed herein and the claims that follow.

What is claimed is:

1. A wideband transmission circuit comprising:
    a power amplifier circuit coupled to a transmitter circuit via a radio frequency (RF) front-end circuit and configured to amplify an RF signal based on a modulated voltage and provide the amplified RF signal to the RF front-end circuit;
    an envelope tracking (ET) integrated circuit (ETIC) configured to generate the modulated voltage based on a modulated target voltage; and
    a transceiver circuit comprising:
        a signal processing circuit configured to generate the RF signal from a time-variant input vector;
        a target voltage circuit configured to detect a time-variant amplitude envelope of the RF signal from the time-variant input vector and generate the modulated target voltage based on the detected time-variant amplitude envelope; and
        an equalizer circuit configured to apply an equalization filter to the time-variant input vector to compensate for a voltage distortion filter created on an output stage of the power amplifier circuit by coupling the power amplifier circuit with the RF front-end circuit, wherein the voltage distortion filter is a function of a reflection coefficient applied to the power amplifier circuit and a reflection coefficient applied to the RF front-end circuit.

2. The wideband transmission circuit of claim 1, wherein the equalization filter is configured to match a combined signal path filter that includes a transfer function of the signal processing circuit, a voltage gain transfer function of the power amplifier circuit, and the voltage distortion filter.

3. The wideband transmission circuit of claim 2, wherein:
    the equalizer circuit is further configured to apply the equalization filter to the time-variant input vector to generate an equalized time-variant input vector; and
    the target voltage circuit is further configured to detect the time-variant amplitude envelope from the equalized time-variant input vector.

4. The wideband transmission circuit of claim 3, wherein the target voltage circuit comprises:
    an amplitude detector circuit configured to detect the time-variant amplitude envelope from the equalized time-variant input vector;
    an ET lookup table (LUT) circuit configured to generate a time-variant digital target voltage based on the detected time-variant amplitude envelope; and
    a digital-to-analog converter (DAC) configured to convert the time-variant digital target voltage into the modulated target voltage.

5. The wideband transmission circuit of claim 3, wherein the signal processing circuit comprises:
    a memory digital predistortion (mDPD) circuit configured to digitally pre-distort the time-variant input vector to generate a pre-distorted time-variant input vector; and
    a modulator circuit configured to generate the RF signal from the pre-distorted time-variant input vector and provide the RF signal to the power amplifier circuit.

6. The wideband transmission circuit of claim 5, wherein the mDPD circuit is further configured to digitally pre-distort the time-variant input vector based on the detected time-variant amplitude envelope.

7. The wideband transmission circuit of claim 3, wherein the equalization filter is expressed as: $H_{ET}(s)=H_{IQ}(s)*H_{PA}(s)*H_{IV}(s)$, wherein:
    $H_{ET}(s)$ represents the equalization filter;
    $H_{IQ}(s)$ represents the transfer function of the signal processing circuit;
    $H_{PA}(s)$ represents the voltage gain transfer function of the power amplifier circuit; and
    $H_{IV}(s)$ represents the voltage distortion filter.

8. The wideband transmission circuit of claim 7, wherein the voltage distortion filter is expressed as: $H_{IV}(s)=\frac{1}{2}*[1-T_{PA}(s)*T_f(s)/[1-T_{PA}(s)]*T_f(s)]$, wherein:
    $T_{PA}(s)$ represents the reflection coefficient applied to the power amplifier circuit; and
    $T_f(s)$ represents the reflection coefficient applied to the RF front-end circuit.

9. The wideband transmission circuit of claim 8, wherein:
    the transceiver circuit further comprises a coefficient lookup table (LUT) configured to store the reflection coefficient applied to the power amplifier circuit and the reflection coefficient applied to the RF front-end circuit; and
    the equalizer circuit is further configured to dynamically create the equalization filter based on the coefficient LUT.

10. The wideband transmission circuit of claim 2, wherein:
    the equalizer circuit is further configured to apply the equalization filter to the time-variant input vector to generate an equalized time-variant input vector; and
    the signal processing circuit is further configured to generate the RF signal from the equalized time-variant input vector.

11. The wideband transmission circuit of claim 10, wherein the signal processing circuit comprises:
- a memory digital predistortion (mDPD) circuit configured to digitally pre-distort the equalized time-variant input vector to generate a pre-distorted equalized time-variant input vector; and
- a modulator circuit configured to generate the RF signal from the pre-distorted equalized time-variant input vector and provide the RF signal to the power amplifier circuit.

12. The wideband transmission circuit of claim 11, wherein the mDPD circuit is further configured to digitally pre-distort the equalized time-variant input vector based on the detected time-variant amplitude envelope.

13. The wideband transmission circuit of claim 10, wherein the target voltage circuit comprises:
- an amplitude detector circuit configured to detect the time-variant amplitude envelope from the time-variant input vector;
- an ET lookup table (LUT) circuit configured to generate a time-variant digital target voltage based on the detected time-variant amplitude envelope; and
- a digital-to-analog converter (DAC) configured to convert the time-variant digital target voltage into the modulated target voltage.

14. The wideband transmission circuit of claim 10, wherein the equalization filter is expressed as: $1/H_{ET}(s)=1/[H_{IQ}(s)*H_{PA}(s)*H_{IV}(s)]$, wherein:
- $H_{ET}(s)$ represents the equalization filter;
- $H_{IQ}(s)$ represents the transfer function of the signal processing circuit;
- $H_{PA}(s)$ represents the voltage gain transfer function of the power amplifier circuit; and
- $H_{IV}(s)$ represents the voltage distortion filter.

15. The wideband transmission circuit of claim 14, wherein the voltage distortion filter is expressed as: $H_{IV}(s)=½*[1-T_{PA}(s)]*[1+T_f(s)]/[1-T_{PA}(s)*T_f(s)]$, wherein:
- $T_{PA}(s)$ represents the reflection coefficient applied to the power amplifier circuit; and
- $T_f(s)$ represents the reflection coefficient applied to the RF front-end circuit.

16. The wideband transmission circuit of claim 1, wherein the RF front-end circuit comprises one or more of: a filter circuit and a multiplexer circuit.

* * * * *

UNITED STATES PATENT AND TRADEMARK OFFICE
CERTIFICATE OF CORRECTION

PATENT NO. : 12,057,813 B2
APPLICATION NO. : 17/700685
DATED : August 6, 2024
INVENTOR(S) : Nadim Khlat and James M. Retz Page 1 of 1

It is certified that error appears in the above-identified patent and that said Letters Patent is hereby corrected as shown below:

In the Claims

In Column 10, Lines 45 and 46, replace:
"$H_{IV}(s)=½*[1-T_{PA}(s)*T_I(s)/[1-T_{PA}(s)]*T_I(s)]$"
With:
--$H_{IV}(s)=½*[1-T_{PA}(s)]*[1+T_I(s)]/[1-T_{PA}(s)*T_I(s)]$--.

Signed and Sealed this
Third Day of September, 2024

*Katherine Kelly Vidal*

Katherine Kelly Vidal
*Director of the United States Patent and Trademark Office*